US008305812B2

(12) United States Patent
Levy et al.

(10) Patent No.: US 8,305,812 B2
(45) Date of Patent: Nov. 6, 2012

(54) FLASH MEMORY MODULE AND METHOD FOR PROGRAMMING A PAGE OF FLASH MEMORY CELLS

(75) Inventors: Shmuel Levy, Qiryat Tivon (IL); Avi Steiner, Kiryat Motzkin (IL)

(73) Assignee: Densbits Technologies Ltd., Haifa (IL)

( * ) Notice: Subject to any disclaimer, the term of this patent is extended or adjusted under 35 U.S.C. 154(b) by 286 days.

(21) Appl. No.: 12/769,208

(22) Filed: Apr. 28, 2010

(65) Prior Publication Data

US 2011/0051521 A1    Mar. 3, 2011

Related U.S. Application Data

(60) Provisional application No. 61/236,911, filed on Aug. 26, 2009.

(51) Int. Cl.
G11C 11/34    (2006.01)

(52) U.S. Cl. ............................ 365/185.19; 365/185.24

(58) Field of Classification Search ............. 365/185.19, 365/185.24
See application file for complete search history.

(56) References Cited

U.S. PATENT DOCUMENTS

| | | |
|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |

(Continued)

OTHER PUBLICATIONS

Mielke, et al. "Flash EEPROM Threshold Instabilities due to Charge Trapping During Program/Erase Cycling", IEEE Transactions on Device and Materials Reliability, vol. 4, No. 3, Sep. 2004, pp. 335-344.

(Continued)

Primary Examiner — Michael Tran
(74) Attorney, Agent, or Firm — SNR Denton US LLP

(57) ABSTRACT

A flash memory module and a method for programming a page of flash memory cells, the method includes: receiving a cycle count indication indicative of a number of program cycles of the page of memory cells; setting a value of a programming parameter of a programming operation based on the cycle count indication; and programming at least one flash memory cell of the page of flash memory cells by performing the programming operation.

29 Claims, 9 Drawing Sheets

U.S. PATENT DOCUMENTS

| | | |
|---|---|---|
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 * | 2/2006 | Roth ........................... 700/282 |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0002633 A1 * | 1/2007 | Gongwer et al. ........ 365/185.24 |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0121386 A1 * | 5/2007 | Ho et al. .................. 365/185.24 |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 * | 7/2008 | Moyer ........................... 365/236 |
| 2008/0162079 A1 * | 7/2008 | Astigarraga et al. .......... 702/182 |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |

| | | | |
|---|---|---|---|
| 2010/0110787 A1 | 5/2010 | Shalvi et al. | |
| 2010/0115376 A1 | 5/2010 | Shalvi et al. | |
| 2010/0122113 A1 | 5/2010 | Weingarten et al. | |
| 2010/0124088 A1 | 5/2010 | Shalvi et al. | |
| 2010/0131580 A1 | 5/2010 | Kanter et al. | |
| 2010/0131806 A1 | 5/2010 | Weingarten et al. | |
| 2010/0131809 A1 | 5/2010 | Katz | |
| 2010/0131826 A1 | 5/2010 | Shalvi et al. | |
| 2010/0131827 A1* | 5/2010 | Sokolov et al. | 714/763 |
| 2010/0131831 A1 | 5/2010 | Weingarten et al. | |
| 2010/0146191 A1 | 6/2010 | Katz | |
| 2010/0146192 A1 | 6/2010 | Weingarten et al. | |
| 2010/0149881 A1* | 6/2010 | Lee et al. | 365/185.33 |
| 2010/0180073 A1 | 7/2010 | Weingarten et al. | |
| 2010/0199149 A1 | 8/2010 | Weingarten et al. | |
| 2010/0211724 A1 | 8/2010 | Weingarten | |
| 2010/0211833 A1 | 8/2010 | Weingarten | |
| 2010/0211856 A1 | 8/2010 | Weingarten | |
| 2010/0251066 A1 | 9/2010 | Radke | |
| 2010/0253555 A1 | 10/2010 | Weingarten et al. | |
| 2010/0257309 A1 | 10/2010 | Barsky et al. | |
| 2010/0293321 A1 | 11/2010 | Weingarten | |
| 2011/0051521 A1 | 3/2011 | Levy et al. | |
| 2011/0055461 A1 | 3/2011 | Steiner et al. | |
| 2011/0096612 A1 | 4/2011 | Steiner et al. | |
| 2011/0119562 A1 | 5/2011 | Steiner et al. | |
| 2011/0153919 A1 | 6/2011 | Sabbag | |
| 2011/0161775 A1 | 6/2011 | Weingarten | |
| 2011/0214029 A1 | 9/2011 | Steiner et al. | |
| 2011/0214039 A1 | 9/2011 | Steiner et al. | |
| 2011/0246792 A1 | 10/2011 | Weingarten | |
| 2011/0246852 A1 | 10/2011 | Sabbag | |
| 2011/0252187 A1 | 10/2011 | Segal et al. | |
| 2011/0252188 A1 | 10/2011 | Weingarten | |
| 2011/0271043 A1 | 11/2011 | Segal et al. | |
| 2011/0302428 A1 | 12/2011 | Weingarten | |
| 2012/0001778 A1 | 1/2012 | Steiner et al. | |
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |

OTHER PUBLICATIONS

JEDEC Standard—Stress-Test-Driven Qualification of Integrated Circuits, JESD47, Dec. 2007.
Dempster, et al., "Maximum Likelihood from Incomplete Data via the EM Algorithm", Journal of the Royal Statistical Society, Series B (Methodological), vol. 39, No. 1, (1977), pp. 1-38.
Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration (VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. 11-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K. Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate nonvolatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J.Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
Jedec Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

FLASH MEMORY MODULE AND METHOD FOR PROGRAMMING A PAGE OF FLASH MEMORY CELLS

REFERENCE TO RELATED APPLICATIONS

This application claims the benefit of U.S. Provisional Patent Application No. 61/236,911, filed Aug. 26, 2009, the entire contents of which are incorporated herein by reference.

FIELD OF THE INVENTION

The present invention relates to an encoding method for programming a page of flash memory cells and a flash memory module.

BACKGROUND OF THE INVENTION

Flash cells are used widely in the industry as memory storage. The Flash cell must be able to program, erase and retain charge on its floating gate. During program or erase the Flash cell is subject to high electric field to support oxide tunneling and hot electron injection. Those are the mechanisms that cause reliability failure.

Most of the available digital integrated circuits (IC) operate on rail-to-rail logic. Flash operation is distinctively analog. The digital information is stored in the analog distribution of the threshold voltage. In multi-level flash cells, multiple bits are stored by precise placement of threshold voltage in each cell. The readout of the threshold voltage requires precise placement of the sense amplifier decision threshold.

The voltage programming and readout are statistical, and there is therefore a probability of error in each decision. The use of error correction codes (ECC) enables reduction of the error rate to an acceptable value, e.g. $10^{-15}$.

There are currently three common methods of programming Flash memory: channel electron ejection, Fowler-Nordhiem (F-N) tunneling from the source or drain, and F-N tunneling from the channel. There are also three common methods for erasing data from the Hash memory: F-N tunneling through the channel, F-N tunneling through the source or drain, and F-N tunneling to the floating gate. These techniques, however, require a high electric field in the oxide and may create traps and leakage current.

The result of fixed program and erase (P/E) cycles with fixed voltage may be significant loss of threshold voltage margin between the program level and the erase level, due to the fact that the programming window remains fixed. Currently known flash devices may use feedback P/E mechanisms, and may employ program and verify or erase and verify. During the verify stage, current methods may measure the correct voltage margin and stop the operation when it is achieved. The result may be a significant increase of cycle count for a given margin.

A second effect of the P/E cycles is the increase of the threshold variance. As the number of cycles increases, the number of traps also increases. The average number of traps reduces the threshold window as discussed above. However, it also increases the threshold variance for every level in the program. The relation to the number of cycles is derived in the empirical model described in: Mielke, N. Belgal, H. Kalastirsky, I. Kalavade, P. Kurtz, A. Meng, Q. Righos, N. Wu, J. "Flash EEPROM Threshold Instabilities Due to Charge Trapping During Program/Erase Cycling", IEEE Transactions on Device and Materials Reliability, Vol. 4, No. 3, September 2004, p 335-344, which is incorporated herein in its entirety by reference.

The bit error rate of a given Flash memory may be related to the threshold voltage window and to the threshold voltage variance at the highest cycle count. The number of errors may be calculated based on Gaussian distribution of the threshold voltage:

$$P_{bit} = \text{erfc}\left(\frac{\frac{W}{\sigma}}{(N_{Levels}-1)2\sqrt{2}}\right) \times \frac{N_{Levels}-2}{N_{Levels} \cdot \log_2(N_{Levels})}$$

Where:
σ=maximum threshold variance
W=minimum threshold window
N=Number of levels (2,4,8)

The minimum threshold voltage window and the maximum threshold voltage variance may be measured at the maximum cycle counts of a given device (100,000 at Single Level Cell, 10,000 at Multi-Level Cell and 1,000 at 3 bits per cell). The device bit error rate (BER) may therefore not be constant with respect to the cycle count and the numbers of errors may constantly increase as the number of cycle increases. The Flash memory controller ECC is designed to correct the highest number of errors at the maximum number of cycles.

It would therefore be advantageous to have a flash memory device with a constant bit error rate, independently of the number of P/E cycles.

SUMMARY OF EMBODIMENTS OF THE INVENTION

According to an embodiment of the invention a flash memory device is provided that includes a flash memory unit that comprises at least one page of flash memory cells; a controller, for receiving a cycle count indication indicative of a number of program cycles of the page of memory cells, and for setting a value of a programming parameter of a programming operation based on the cycle count indication; and programming at least one flash memory cell of the page of flash memory cells by performing the programming operation.

According to an embodiment of the invention, a method is provided for programming a page of flash memory cells, which includes: receiving a cycle count indication indicative of a number of program cycles of the page of memory cells; setting a value of at least one flash memory programming parameter of a programming operation based on the cycle count indication; and programming at least one flash memory cell of the page of flash memory cells by performing the programming operation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
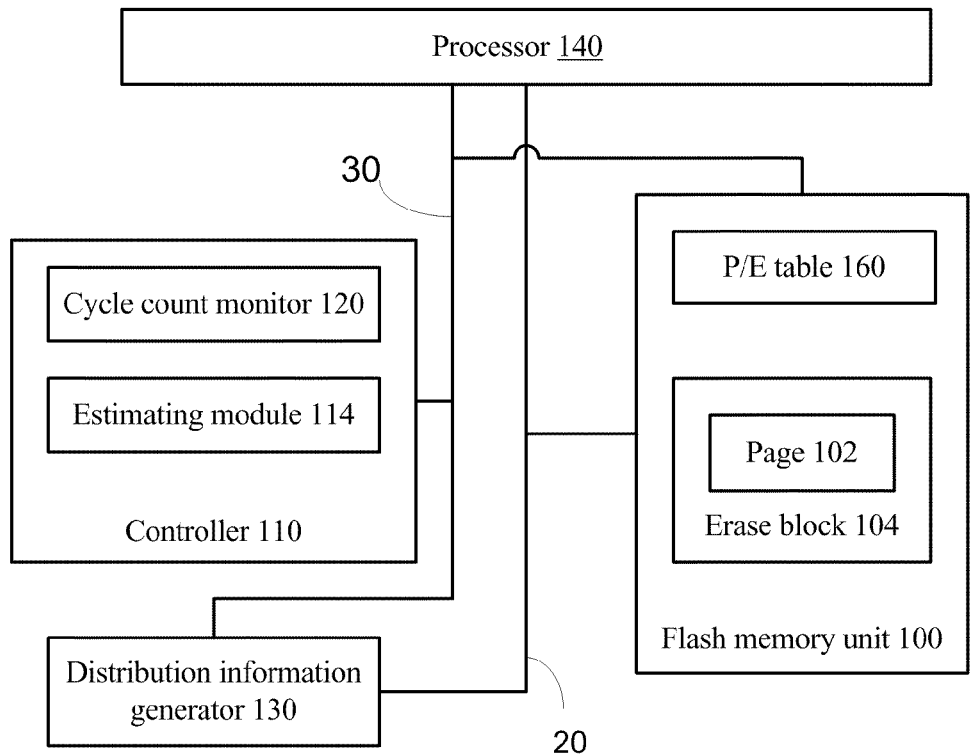
FIG. 1 is a simplified functional block diagram of a flash memory module according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to one embodiment of the invention, a method for controlling a flash memory module is disclosed, the method including: (i) receiving a P/E cycle count indication, indicative of the cycle count of at least one erase block (or of a changing of such cycle count), and setting at least one voltage parameter according to the P/E cycle count indication.

According to an embodiment of the invention, the setting of the at least one voltage parameter may be followed by carrying out an erase operation, a program operation, a read operation (or other type of flash voltage dependent module operation) wherein that operation depends on the value of the at least one voltage parameter.

According to an embodiment of the invention, the setting includes setting a threshold voltage window and the corresponding multi level target threshold voltages according to the cycle count of each erase block. According to an embodiment of the invention, the setting includes increasing target threshold voltages as the cycle count increases.

According to an embodiment of the invention, the setting includes setting the voltage for the erase operation of the flash module. According to an embodiment of the invention, the setting may include setting higher voltages for the erase operation as the cycle count increases. According to an embodiment of the invention, the setting includes ceasing to increasing the at least one voltage parameters in response to an erase verify operation.

According to an embodiment of the invention, the setting may include setting the at least one voltage parameter in response to at least one value retrieved from a predefined table (e.g. a P/E table), wherein the table may include one or more program and/or erase voltage values per each cycle count—or a range of cycle counts.

According to an embodiment of the invention, the setting may include determining a value of the at least one voltage parameter to be set by processing a formula that is responsive to the cycle count (or cycle count range).

According to an embodiment of the invention, the retrieving may include reading a block cycle counter during the erase operation, wherein the setting may include setting the erase initial voltage accordingly, by setting the erase parameters.

According to an embodiment of the invention, the retrieving may include reading a block cycle counter during the page program operation, wherein the setting may include setting the program thresholds for all pages within the block.

Reference is made to FIG. 1, which illustrates a flash memory module 10 according to an embodiment of the invention. Flash memory module 10 may include a flash memory unit 100, controller 110, processor 140, and distribution information generator 130. Flash memory module 10 may include a data path 20 connected to processor 140, flash memory unit 100, and distribution information generator 130. Flash memory module 10 may further include a control path 30 connected to processor 140, controller 110, distribution information generator 130, and flash memory unit 100, for facilitating exchange of instructions therebetween.

Flash memory unit 100 may include at least one page 102 of flash memory cells. Flash memory unit 100 may include multiple erase blocks, such as erase block 104, each of which may include multiple pages. Flash memory unit 100 may further include a P/E table 160, as described hereinbelow.

Flash memory module 10 may also include controller 110 to control the programming of flash memory cells, and the erasing of flash memory cells. Controller 110 may also control retrieval of information from the flash memory cells during read operations. Controller 110 may receive or generate a cycle count indication indicative of a number of program cycles (erase cycles) of the page of memory cells, wherein each erase cycle may be delimited between two program cycles. Controller 110, after receiving the cycle count indication, may set a value of one or more programming parameters of a programming operation based on the cycle count indication. After the programming parameter is set, the controller 110 may program at least one flash memory cell of the page of flash memory cells by performing the programming operation.

The programming operation may be triggered by receiving a request to write information to the page of flash memory cells. The information may include multiple information elements, and the programming may include programming multiple flash memory cells to store these multiple information elements.

The programming parameter set by controller 110 may be at least one of the following parameters: (i) a size of a programming step of a sequence of programming pulses supplied to a flash memory cell during the programming operation; (ii) a target threshold voltage level; (iii) a threshold voltage window that includes multiple target voltage levels of a flash memory cell that represent multiple target logic values, (iv) a distribution of threshold voltages of flash memory cells.

In some embodiment of the invention, the programming step may be substantially the same for all lobes of a certain page type (e.g., Most Significant Bit (MSB) page, Least Significant Bit (LSB) page, etc.), because the flash memory modules may use an internal parallel programming mechanism to simultaneously program several lobes. However, in other cases, there may be several programming step parameters, e.g., a parameter per page type, or a set of values per page type, etc.

The controller 110 may set the target threshold voltage level based on a mapping between cycle count indication ranges and target threshold voltage levels.

The controller 110 may increase, during the life of the flash memory unit 100, the threshold voltage window. The initial threshold voltage window may be set by the controller 110 at the beginning of life of the page of flash memory cells to be less than a fraction, e.g., half, of a final threshold voltage window set by the controller 110 at an end of life of the page of flash memory cells.

Conveniently, the controller 110 may be configured to set a value of an erase parameter of an erase operation based on the cycle count indication. The controller 110 may erase at least one flash memory cell of the page of flash memory cells by performing the erase operation.

FIG. 1 illustrates an embodiment of the present invention in which controller 110 includes cycle count monitor 120 for generating the cycle count indication. It is noted that in some alternate embodiments of the invention, cycle count monitor 120 need not be part of the controller 110, but rather, may belong to another component of flash memory module 10.

According to an embodiment of the invention, controller 110 may be configured to receive distribution information from a distribution information generator 130. The distribution information may be indicative of a distribution of actual threshold voltages of flash memory cells of the page of flash memory cells. The controller 110 may set the value of the programming parameter based on the cycle count indicator and on the distribution information.

The distribution information generator 130 may write information to the cells of the memory page and read the content of the flash memory cells and generate a histogram that maps threshold voltage values to a number of flash memory cells set to these threshold voltage values. The distribution information generator 130 may provide more accurate information that indicates which flash memory cells are programmed to these threshold voltages. Alternately, the distribution information generator 130 may read the contents of flash memory cells, without necessarily writing information to the flash memory cells.

According to an embodiment of the invention, the programming parameters may be responsive to a future distribution of threshold voltages, for example, to the distribution at the end of the life of the flash memory unit 100. This future distribution may be estimated in any of a variety of methods, such as applying a statistical retention model.

Conveniently, the controller 110 may be configured to: (i) receive distribution information indicative of a distribution of actual threshold voltages of flash memory cells of the page of flash memory cells; (ii) apply a statistical retention model on the distribution information to provide an estimated distribution information; and (iii) set the value of the programming parameter based on the estimated distribution information and on the cycle count indication.

A statistical retention model may be applied by an estimating module 114. It will be understood that in the illustration of an embodiment of the invention depicted schematically in FIG. 1, estimating module 114 is illustrated as belonging to controller 110; however, in other embodiments of the invention, this need not necessarily be the case. The estimating module may be otherwise associated with processor 140, such that statistical retention model may be applied, for example, by processor 140 belonging to or otherwise accessible by flash memory module 10. It is noted that estimating module 114 may be configured, programmed or otherwise adapted to perform other types of estimations.

According to an embodiment of the invention, controller 110 may be configured to (i) receive distribution information that is indicative of a distribution of actual threshold voltages of flash memory cells of the page of flash memory cells; (ii) estimate a distribution of threshold voltages of flash memory cell at an end of life of the page of flash memory cells to provide an estimated distribution information; and (iii) set the value of the programming parameter based on the estimated distribution information and on the cycle count indication. It is noted that controller 110 may estimate the future distribution at points in time that differ from the end of life of page of flash memory cells.

According to an embodiment of the invention, a desired distribution of the threshold voltages may be defined and obtained by repeating some of the above-mentioned stages. The controller 110 may repeatedly receive distribution information, apply of a statistical retention model, set the value of the programming parameter, and program the at least one flash memory cell until reaching a desired distribution of threshold voltages of flash memory cells.

According to an embodiment of the invention the controller 110 can update the estimation model used to estimate a future distribution of threshold voltages. It will be recognized that in the present description, the estimation model is also referred to as a retention model. If, for example, the estimated distribution information is received by the controller at a first point in time (T1) and is indicative of an estimated distribution of threshold voltages of flash memory cells of the page of flash memory cells at a second point in time (T2) that follows the first point in time (T1), then controller 110 may be further configured to: (i) receive updated distribution information indicative of a distribution of actual threshold voltages of flash memory cells of the page of flash memory cells at the second point in time (T2), and (ii) update the statistical retention model based on a difference between the estimated distribution information and the updated distribution information.

It may be desirable to re-program a page of memory cells if errors are unevenly distributed between different target read threshold voltage levels. For example, some lobes may overlap too much, while others may be too far from each other, leaving gaps between adjacent lobes. Accordingly, controller 110 may be configured to: (i) receive distribution information that is indicative of a distribution of actual threshold voltages of flash memory cells of the page of flash memory cells; (ii) determine a level of uniformity of errors among different target voltage levels; and (iii) re-program the page of flash memory cells if the level of uniformity is below a threshold.

It is noted that the mapping between cycle counts and values of one or more programming parameters may be performed for any grouping of memory cells, e.g., per a flash memory module, per a batch of flash memory modules, or even per a larger group of flash memory modules.

The mapping may be performed during a sorting operation carried out during the production of the flash memory module. This may involve selecting, e.g., arbitrarily, one or more flash memory modules, and checking the values of the programming parameters that should be applied.

The reliability of flash memory cells may decrease as the number of P/E cycles increases. It is noted that error correction codes may be used during the entire life cycle of the device. It is noted that prior art designs may use a fixed size window regardless the threshold variance.

According to embodiments of the invention, the threshold voltage window may gradually be increased with respect to the cycle count, so that the program voltage stress may be reduced, and the number of cycles may be increased.

According to the invention, a flash memory module is disclosed, in which a cycle-dependent threshold voltage window may be implemented, using higher threshold voltage windows as the cycle count increases.

It is noted that according to an embodiment of the invention, the starting value for the threshold voltage window may be very small, since the device performance degradation at the start of life of the flash memory module is small, and thus memory reliability can be obtained at a low threshold voltage window. For example, the nominal threshold voltage window can be in the range of 5V-7V, and the lower threshold voltage window can be in the range of 3V-5V. In general, the configuration of the low threshold voltage window can be for any value above 0V and below the maximal programming voltage.

It is known in the art that a main cause for flash reliability degradation is the program and erases voltage. According to an embodiment of the invention, the flash memory module utilizes variable threshold voltage window for the program voltage, thereby enabling the use of a variable voltage range for the erase voltage.

Some current flash devices have a mechanism for controlling the initial voltage for the erase operation, but contrary to embodiments of the present invention, such current flash devices do not change the erase voltage for the erase operation from the initial voltage. According to an embodiment of the invention, the flash memory module may be configured to change the erase voltage, and change the preprogramming erase voltage for the erase operation throughout the operation of the flash memory module. That is, in different times during a period in which the flash memory module is active, different voltages for the erase operation may be used. Starting from an initial voltage, the controller may gradually increase the initial erase voltage and preprogramming voltage depending on the P/E cycle count and on the programming voltage window.

According to an embodiment of the invention, an initial erase value may be in the range of 12 to 27 Volts. According to an embodiment of the invention, the erase value may start with the lowest voltage when the cycle counter is set to zero, and gradually increase until it reaches the highest value, e.g., towards the end of life of the flash memory module, when the cycle counter nears or reaches the end.

It is noted that according to such an implementation of the present invention, the average erase voltage across the device life cycle may be reduced, and the device reliability may increase. Since the device may have lower Bit Error Rate, the device can operate at a higher cycle count, thereby achieving a higher value than a device with fixed erase voltage.

According to an embodiment of the invention, the controller of the flash module may use a program erase (P/E) table 160 that maps target threshold voltages and erase voltages with ranges of cycle counts. It will be recognized that while P/E table 160 is shown in FIG. 1 as being stored in the flash memory unit 100, in some embodiments of the invention, P/E table may be stored outside the flash memory unit 100, and accessible thereto. P/E table 160 may store target threshold voltage values and erase voltage values per each range of cycle count. It is noted that in some embodiments of the invention, the mapping may be calculated by controller 110 without necessarily using such a table.

Table 1 illustrates an example of a P/E table 160 for a three bit per cell flash memory cell. It stores three target threshold voltages (one fore each logic value) and an erase voltage per each range of cycle counts. "Program 1" is a target threshold value that is associated with a logic level of one. "Program 2" is a target threshold value that is associated with a logic level of two. "Program 3" is a target threshold value that is associated with a logic level of three. Erase Vpp is the preprogramming erase voltage (which is the target threshold voltage in the programming of all cells performed during issuing of the erase command)

TABLE 1

| Cycles | Program 1 (V) | Program 2 (V) | Program 3 (V) | Erase Vpp (V) | Erase (V) |
|---|---|---|---|---|---|
| 0-1000 | 0.6 | 1.2 | 1.8 | 3 | 10 |
| 1000-2000 | 0.7 | 1.3 | 2.0 | 3.5 | 11 |
| . | . | . | . | . | . |
| . | . | . | . | . | . |
| . | . | . | . | . | . |
| 19,000-20,000 | 1.7 | 3.4 | 5.1 | 6.9 | 20 |

It will be appreciated that using smaller threshold voltage windows may reduce the effect of charge traps, increase the reliability of the flash memory unit, and may speed up the erase operation.

Referring to calibration of programming parameters based on a known model, it is noted that automatic programming parameters may enable embodiments of the invention to achieve higher cycle counts, thereby improving the flash specification.

If there is no compensation for inconsistency among flash devices (for overcoming physical differences between flash devices of the same family) then the maximal achievable cycle count may be limited, since sub-optimal programming is used, which may provide high error values in low cycle counts. By using the calibration mechanism, the programming process may be optimized to minimize or reduce the number of errors for every cycle count range.

Figure 3:
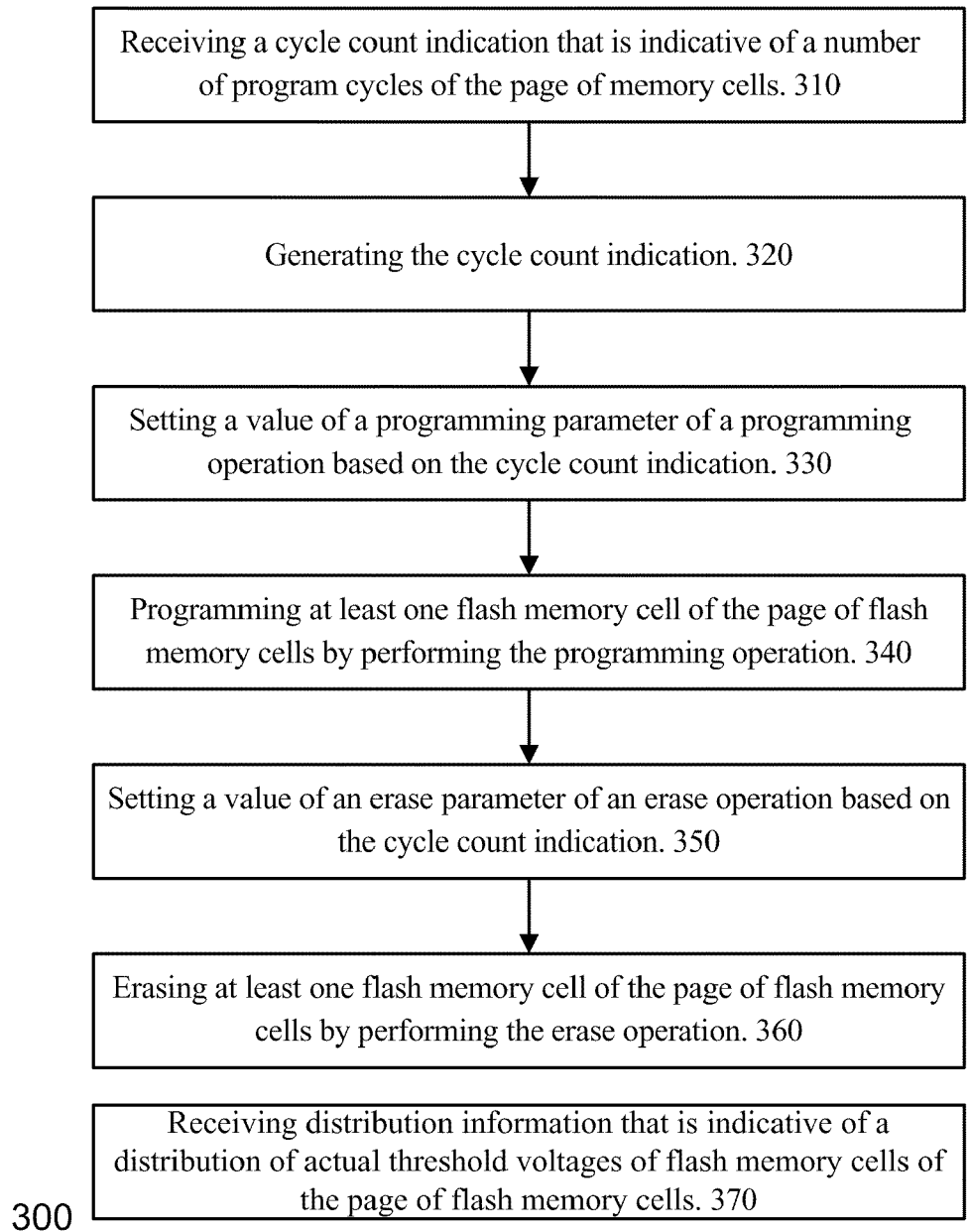
FIG. 3 illustrates a method according to an embodiment of the invention.

FIG. 3 is a flow chart of a method 300 for programming a page of flash memory cells, according to an embodiment of the invention. The method 300 may start by stage 310 or stage 320.

Stage 310 may include receiving a cycle count indication indicative of a number of program cycles of the page of memory cells.

Stage 320 may include generating the cycle count indication. Stage 320 may include monitoring the number of programming cycle or counting the number of erase cycles. A programming cycle may span two consecutive erase cycles, and thus the program cycle count indication may be regarded as equivalent to an erase cycle count indication. This cycle is also referred to as a program erase (P/E) cycle.

Stage 310 and/or 320 may be followed by stage 330, which may include setting a value of a programming parameter of a programming operation based on the cycle count indication. Stage 330 may include setting values of multiple programming parameters. Parameters that may be set by the Flash controller include: (a) a size of a programming step of a sequence of programming pulses that are supplied to a flash memory cell during the programming operation; (b) a value of a first programming pulse out of a sequence of programming pulses that are supplied to a flash memory cell during the programming operation of the flash memory cell; (c) a target threshold voltage level of a flash memory cell that represents a target logic value; (d) a threshold voltage window that includes multiple target voltage levels of a flash memory cell, the multiple target voltage levels represent multiple target logic values; (e) a target distribution of threshold voltages of flash memory cells that belong to a page of flash memory cells.

The target distribution may include a target distribution per lobe, which may be characterized by a standard deviation per lobe, or any other suitable target distribution. A lobe may represent a distribution of values of actual threshold voltages of flash memory cells that should store the same logical value.

It will be recognized that in designing and programming embodiments of the invention, larger programming step sizes and/or higher first programming pulse values may speed up the programming process, but may provide coarser results. That is, the actual threshold voltages of flash memory cells may be spread over larger ranges, but the "lobes" of the threshold voltages may be wider.

The programming threshold voltage of the highest logical value (highest lobe) may determine the voltage window size. Adapting the programming parameters as function of the cycle count may require increasing the spacing between the logical values as the P/E cycle counter increases. This means that the highest lobe voltage may gradually increase, and thus, the threshold voltage window may increase.

The threshold voltage windows may be set so that the average threshold voltage window may be smaller in comparison to a threshold voltage window that should have been applied in a fixed scenario in which the threshold voltage window remains unchanged during the entire life of the memory unit. This smaller average window may contribute to the reliability of the flash memory unit.

According to an embodiment of the invention the flash memory calls can store more than two logical levels per cell and the programming parameters associated with each logical level can be set per each logical level. This is not necessarily so and some programming parameters (such as the size of the programming step) can be defined per all (or more than one) logic levels.

Conveniently, stage 330 may include increasing a target threshold voltage level as a result of an increase in the number of program cycles. The increment may be based on a monotonic rising function. The programming parameter may be incremented as a response of each increment in the cycle count, but this not necessarily so. For example, the programming parameter may be increased per each range of count cycles. The ranges may be equal to each other or may differ in size from each other. Thus, stage 330 may include setting the target threshold voltage level based on a mapping between cycle count indication ranges and target voltage levels. Such a mapping may be provided, for example, by the P/E table illustrated above.

Stage 330 may be followed by stage 340, which may include programming at least one flash memory cell of the page of flash memory cells by performing the programming operation. The programming operation may be performed while the programming parameter is set to the value based on the cycle count indication.

According to an embodiment of the invention, method 300 may include stages 350 and 360. Stage 350 may include setting a value of an erase parameter of an erase operation based on the cycle count indication. Stage 360 may include erasing at least one flash memory cell of the page of flash memory cells by performing the erase operation. It is noted that stage 350 can alternately be viewed as a part of stage 330, and stage 360 can alternately be viewed as being a part of stage 340, insofar as an erase operation involves programming a flash memory cell to an erase value. Stage 350 may include setting a value of a pre-programming voltage to be applied before the erasing. Stage 360 may include supplying the pre-programming voltage to the flash memory cells of a block of flash memory cells that are about to be erased.

Conveniently, the value of the preprogramming voltage may change according to the threshold voltage window size, e.g., according to the cycle count indication. The preprogramming may obtain a narrow erase level distribution. According to the invention, the value of the preprogramming voltage may be proportional to the threshold voltage window size.

According to an embodiment of the invention, method 300 may include stage 370, receiving distribution information indicative of a distribution of actual threshold voltages of flash memory cells of the page of flash memory cells. Stage 370 may be followed by stage 330 which may include setting the value of the programming parameter based on the distribution information and on the cycle count indication. The distribution information may provide indication about lobes that are more prone to errors, and/or an indication that some lobes should be separated from each other, and/or an indication of whether the entire threshold voltage window should be expanded in order to increase the distance between adjacent lobes.

In order to achieve a desired programming result, characterized by its threshold voltage level distribution, a calibration process may be suggested. According to embodiments of the invention, there may be provided an automatic program tuning scheme, in which the initial programming parameters are chosen as a function of the cycle count. Every set of parameters may yield a desired voltage level distribution. It is however noted that the flash devices of the same process may be different in their performance due to physical mismatches such as production in different lots. The calibration process may be designed to overcome programming result mismatches. A calibrated program may have an error distribution among read thresholds and page types, which corresponds to a predefined distribution, at device end-of-life. The read thresholds may equal the target threshold voltages or may be set to include an entire lobe (or at least most of the lobe) that corresponds to a target threshold voltage.

According to an embodiment of the invention, such a test may be performed with a statistical retention model for the family of devices.

According to an embodiment of the invention, a calibration process is disclosed, including, for a given programming parameter set, the following stages: (i) programming an entire block or a part of a block of flash memory cells with the controller input data (does not need to be known data); (ii) finding threshold voltages for sufficiently many cells on relevant page ("Vt Scan"), (iii) applying the statistical retention model on the Vt scan samples; (iv) adjusting one or more programming parameter; (v) programming the block of flash memory cells; and (vi) re-scanning the actual threshold voltages and determining whether to repeat stages (i)-(v) until reaching a desired distribution. Note that repetition of the procedure may be applied on different data as to allow "zero" programming overhead of the calibration procedure.

According to an embodiment of the invention, calibration may be done on the input data, with no need for dedicated training data, because the calibration may be performed at the beginning of every cycling range. Lower cycle counts may suffer less from the retention effect (smaller shift and smaller STD degradation). Therefore, once a block is programmed first, at entrance to a new cycling range, it may be more robust against calibration errors. Then the calibration can be done, which results in updated programming parameter set. The next time this block (or another block, which reaches the same cycling range) is programmed, the calibration process may be repeated. Parameters may be updated substantially only if there are further mismatches between the program result and the reference model. It is noted that the program parameter set may be different for every page.

Figure 4:
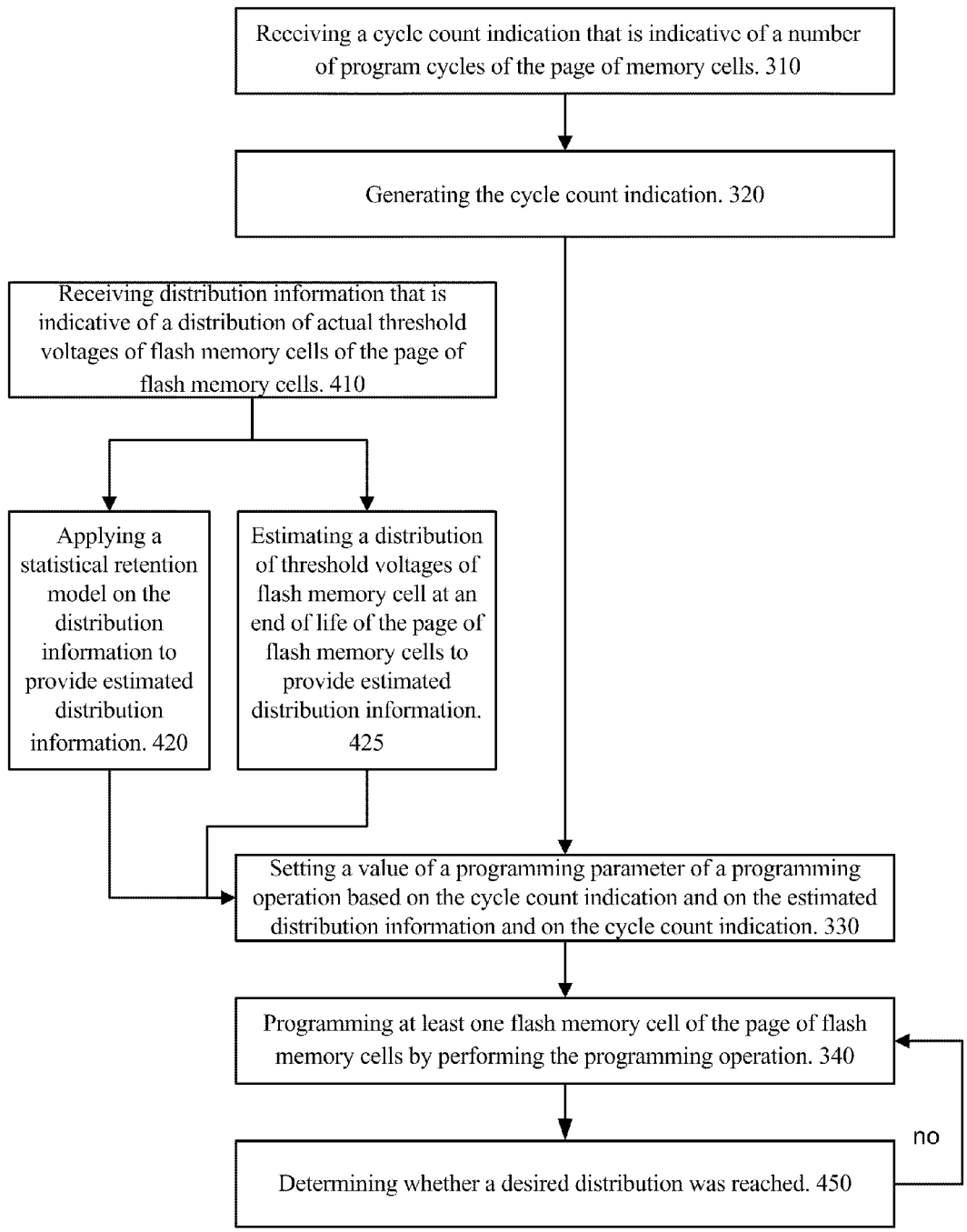
FIG. 4 illustrates a method according to an embodiment of the invention.

FIG. 4 is a flow chart of a method 400 for programming a page of flash memory cells, according to an embodiment of the invention. Method 400 may start by any of stages 310, 320 and 410. Stage 310 may include receiving a cycle count indication indicative of a number of program cycles of the page of memory cells. Stage 320 may include generating the cycle count indication. Stage 320 may include monitoring the number of programming cycle or counting the number of erase cycles. A programming cycle may span two consecutive erase cycles thus the program cycle count indication should be regarded as an equivalent to an erase cycle count indication.

Stage 410 may include receiving distribution information indicative of a distribution of actual threshold voltages of flash memory cells of the page of flash memory cells. Stage 410 may be followed by stage 420 or stage 425. Stage 420 may include applying a statistical retention model on the distribution information to provide estimated distribution information. Stage 425 may include estimating a distribution of threshold voltages of flash memory cell at an end of life of the page of flash memory cells to provide estimated distribution information.

Stages 310, 320, 420 and 425 may be followed by stage 330 of setting a value of a programming parameter of a programming operation based on the cycle count indication and on the estimated distribution information and on the cycle count indication. Stage 330 may include setting values of multiple programming parameters. A programming parameter can be selected from any one or more of: (a) a size of a programming step of a sequence of programming pulses that are supplied to a flash memory cell during the programming operation; (b) a value of a first programming pulse out of a sequence of programming pulses that are supplied to a flash memory cell during the programming operation of the flash memory cell; (c) a target threshold voltage level of a flash memory cell that represents a target logic value; and (d) a threshold voltage window that includes multiple target voltage levels of a flash memory cell, the multiple target voltage levels represent multiple target logic values.

Stage 330 may be followed by stage 340, including programming at least one flash memory cell of the page of flash memory cells by performing the programming operation. The programming operation is preformed while the programming parameter is set to the value that is based on the cycle count indication.

Conveniently, stages 410, 420, 330 and 340 may be repeated until reaching a desired distribution of threshold voltages of flash memory cells, as illustrated by query stage 450, including determining whether a desired distribution was reached. The desired distribution may be a uniform distribution, and/or a distribution that does not include overlaps between lobes, and/or a distribution that does not include substantially overlap between lobes, etc.

Figure 2:
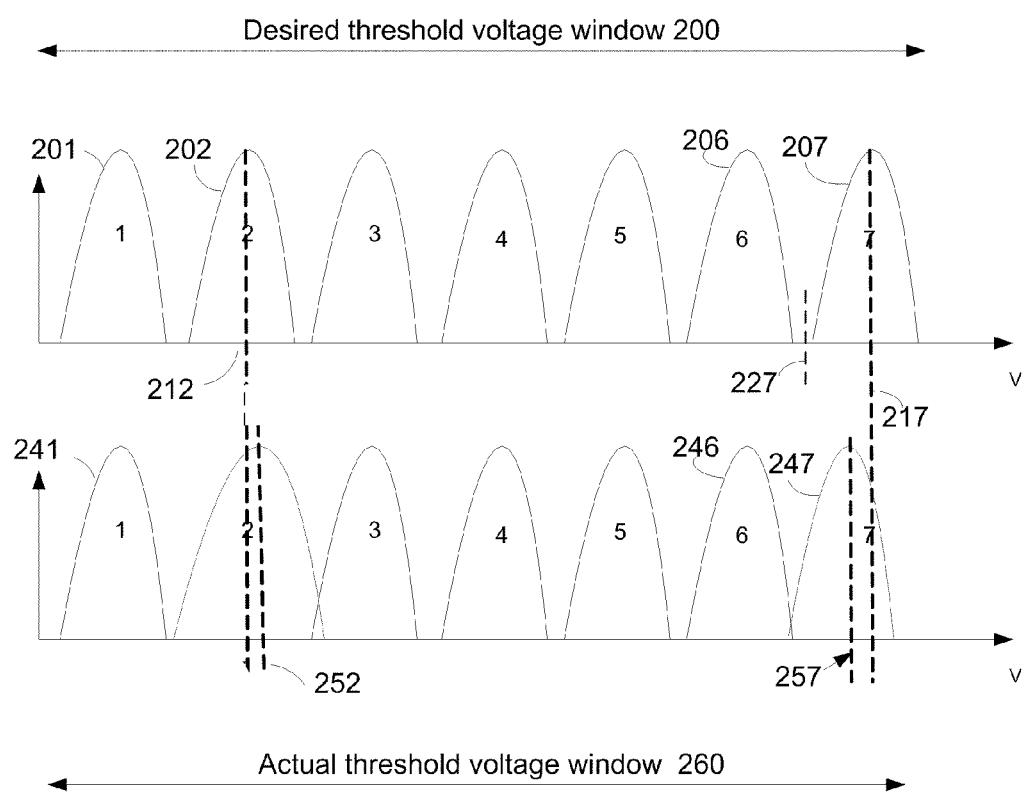
FIG. 2 illustrates a distribution of threshold voltages of flash memory cells of a page of flash memory cells according to an embodiment of the invention.

FIG. 2 illustrates an example of a desired distribution of threshold voltages and an actual distribution of threshold voltages according to an embodiment of the invention.

The illustrated desired threshold voltage distribution includes seven spaced apart and symmetrical lobes 201-207, corresponding to seven levels per cell). The target threshold voltage of each lobe, such as 217 and 212, is positioned at the center of each lobe. The seven lobes 201-207 are arranged within a desired threshold voltage window 200. FIG. 2 also illustrates a seventh read threshold 227 that is located at the left of seventh lobe 207.

The actual threshold voltage distribution includes seven lobes 241-247, corresponding to a seven levels per cell. Some of these lobes overlap, for example, second and third lobes, sixth and seventh lobes, and some of these lobes are asymmetrical or otherwise characterized by a threshold voltage distribution that deviates from the desired distribution. For example, the second lobe 242 is wider than desired, and its center, e.g., the target threshold voltage, is higher than desired.

The lobes 241-247 may be arranged within an actual threshold voltage window 260. The actual distribution of threshold voltages may be non-uniform, in the sense that some lobes overlap and some lobes are asymmetrical. In such a case, and assuming that the uniformity is below a threshold, the page of flash memory cells may be re-programmed in order to obtain the desired distribution of threshold voltages. It is noted that the desired distribution of threshold voltages may be characterized by uneven differences between lobes.

Figure 7:
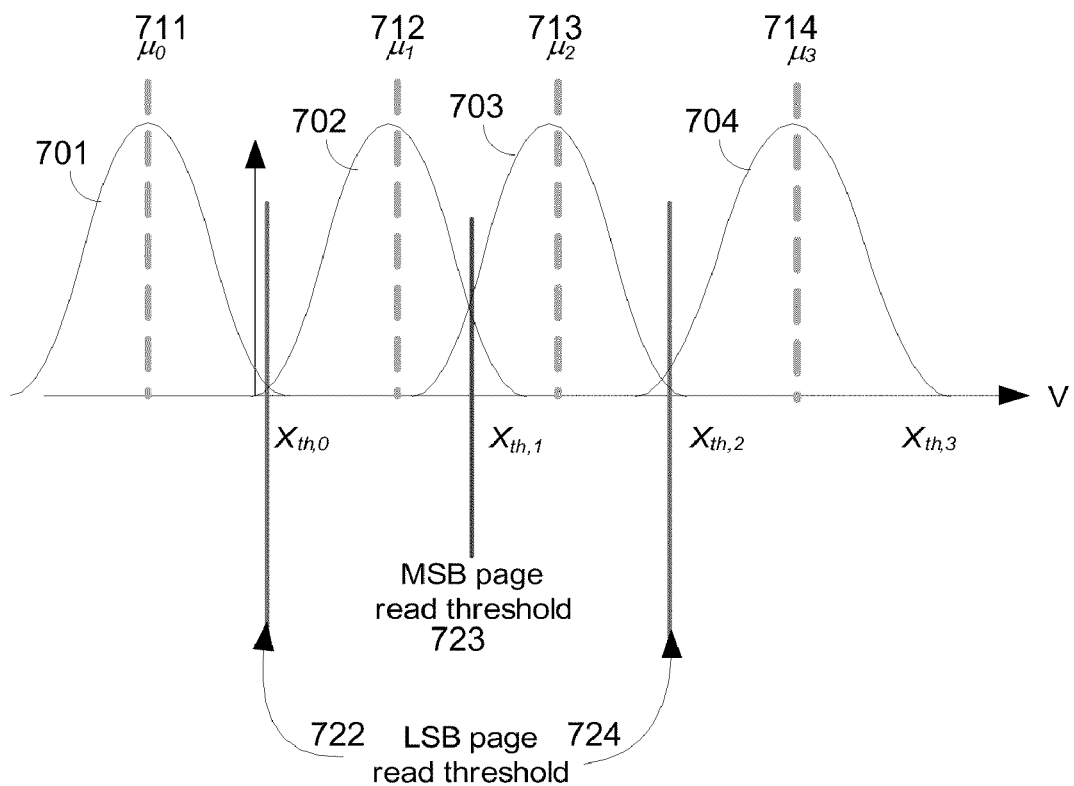
FIG. 7 illustrates a distribution of threshold voltages of flash memory cells of a page of flash memory cells according to an embodiment of the invention.
Figure 8:
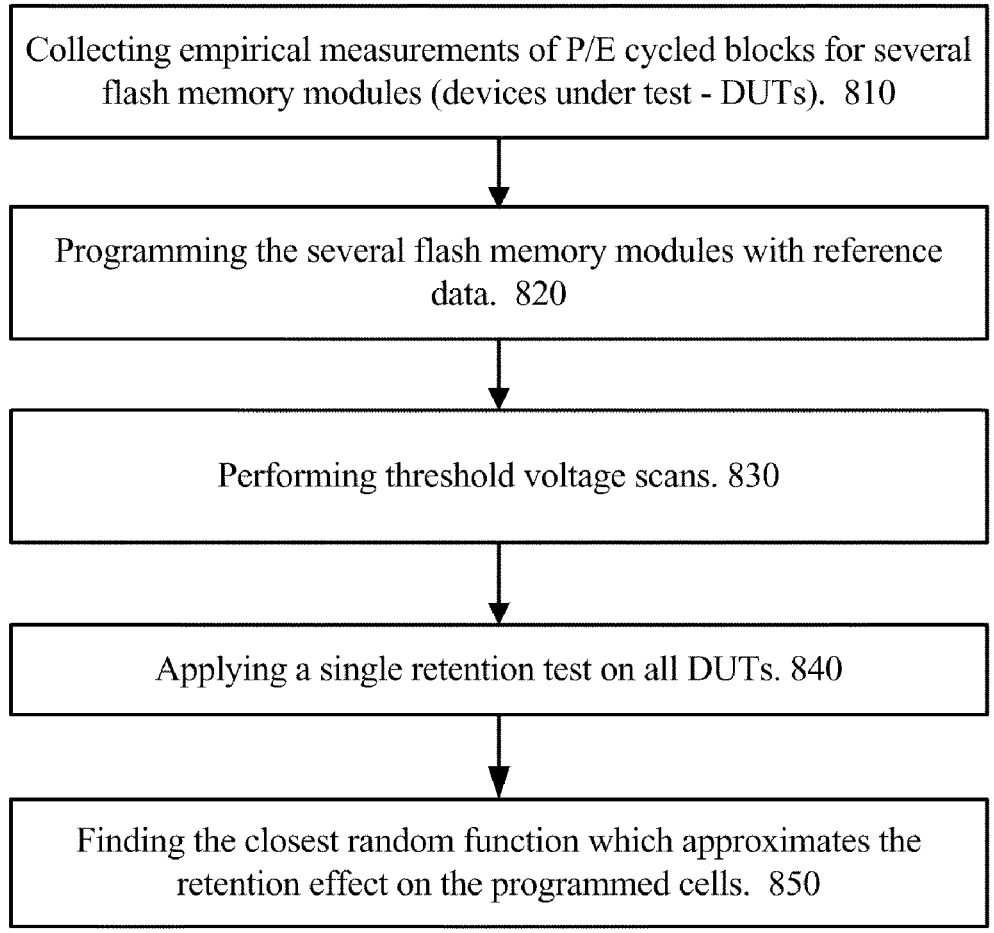
FIG. 8 illustrates a method according to an embodiment of the invention.

FIG. 7 illustrates a reference voltage level distribution for a two-bit per cell flash memory according to an embodiment of the invention.

FIG. 7 illustrates four lobes 701-704, which are not equally spaced. The second lobe 702 is closer to the third lobe 703 than to the first lobe 701. The third lobe 703 is closer to the second lobe 702 than to the fourth lobe 704.

The target threshold voltages 712 and 713, which are located in the center of second and third lobes 702 and 703, are closer to each other than to the first and fourth target threshold voltages 711 and 714.

Such a distribution may be beneficial, for example, to achieve an equal Unequal Bit-Error Rate (UBER) at end-of-life for all page types, e.g., most significant bit (MSB) page and least significant bit (LSB) page. The MSB page, as illustrated, may require comparison with a single read threshold (723), while the LSB page read may involve comparison with two thresholds (722 and 724). Therefore, the probability of error with equal spacing provides unequal UBER for MSB and LSB pages. Pre-equalization during programming can be used to provide equal UBER.

According to an embodiment of the invention the estimation process can be evaluated and fine tuned. A statistical retention model or any other estimate may be tuned, according to actual flash device performance When reading an "old" page of flash memory cells, the error distribution among the read thresholds may be computed. An "old" page of flash memory cells may be determined by the number of corrected errors. When the number of corrected errors exceeds a threshold, the page of flash memory cells may be defined as "old". Another possible definition of an "old" page may be a page decoded only with soft decoding). For an "old" page of flash memory cells, the error distribution over near-optimal read thresholds may be used to determine whether or not the retention model requires a modification. Thus, if errors are uniformly distributed around read thresholds, then no adaptation may be required. Otherwise, the page of flash memory cells may be re-programmed and, additionally or alternatively, the estimation model that was used in relation to that page may be calibrated.

According to an embodiment of the invention, a resolve mechanism is disclosed, which may be used in relation to the herein disclosed process: pages of flash memory cells with non-uniform error distribution may be re-programmed, such that the content of the page of flash memory cells may be copied to another free page of flash memory cells, and this page of flash memory cells may be reprogrammed with the updated programming parameters.

Figure 5:
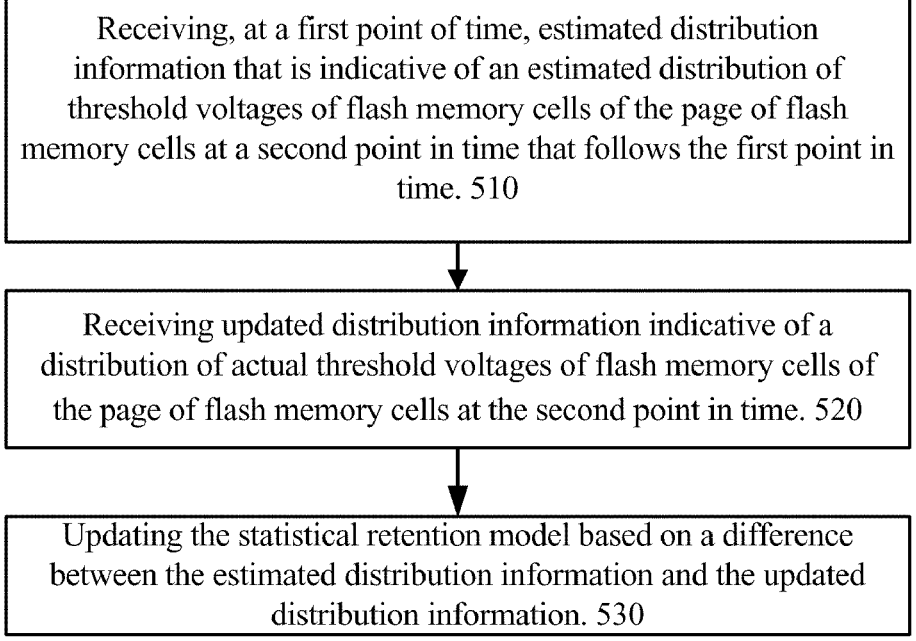
FIG. 5 illustrates a method according to an embodiment of the invention.

As indicated above, an estimation model such as a statistical retention model can be updated, as illustrated in FIG. 5. Method 500 of FIG. 5 may include stages 510, 520 and 530.

Stage 510 may include receiving, at a first point of time, estimated distribution information that is indicative of an estimated distribution of threshold voltages of flash memory cells of the page of flash memory cells at a second point in time that follows the first point in time.

Stage 520 may include receiving updated distribution information indicative of a distribution of actual threshold voltages of flash memory cells of the page of flash memory cells at the second point in time.

Stage 530 may include updating the statistical retention model based on a difference between the estimated distribution information and the updated distribution information.

Figure 6:
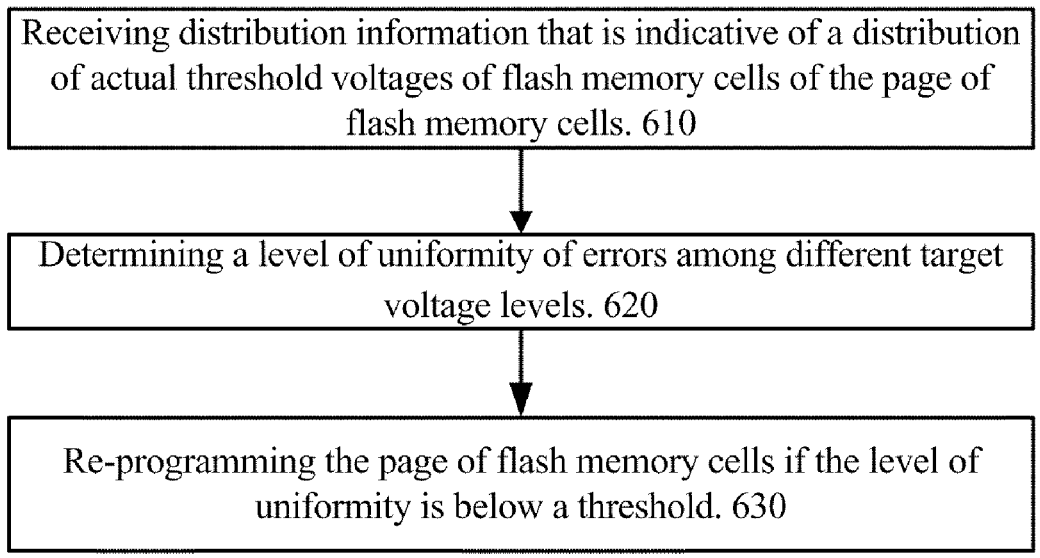
FIG. 6 illustrates a method according to an embodiment of the invention.

FIG. 6 illustrates a method 600 according to an embodiment of the invention. Method 600 may start by stage 610, including receiving distribution information indicative of a distribution of actual threshold voltages of flash memory cells of the page of flash memory cells.

Stage 610 may be followed by stage 620, including determining a level of uniformity of errors among different target voltage levels.

Stage 620 may be followed by stage 630, including re-programming the page of flash memory cells if the level of uniformity is below a threshold. The re-programming of stage 630 may include re-programming the page of flash memory cells by applying programming operations characterized by programming parameters that are based on a cycle count indicator.

According to the invention, an automatic programming calibration scheme may be introduced, which may further increase the cycle count of the flash memory unit. The automatic calibration may compensate for mismatches between devices with identical sets of parameters. This automatic calibration may result in setting one or more programming parameters. For every P/E cycle range there may be a different set of programming parameters that may be required in order to adapt the threshold voltage window size to cycle count, and increase programming speed.

The end-of-life distribution may depend on several factors related to the memory wear-out. One of the dominant factors may be the accumulated traps during P/E cycling, and the time duration from the last program operation. The relation of traps accumulation and P/E cycles is studied in Mielke, N. Belgal, H. Kalastirsky, I. Kalavade, P. Kurtz, A. Meng, Q. Righos, N. Wu, J. "Flash EEPROM Threshold Instabilities Due to Charge Trapping During Program/Erase Cycling", IEEE Transactions on Device and Materials Reliability, Vol. 4, No. 3, September 2004, p 335-344. The end-of-life requirements may be defined, for example, by 100% P/E cycles and one-year retention, and 10% P/E cycles and 10-year retention. An example of flash testing spec may be found in JEDEC STANDARD-Stress-Test-Driven Qualification of Integrated Circuits, JESD47, December 2007, where it may be expected that the memory will be reliable with probability of error $<10^{-15}$. The retention test may be accelerated by performing the test at high temperature. For every programming set of parameters, the retention test may yield different results, with different voltage level distributions.

In order to predict the effect of the retention test, method 800 may be executed. Method 800 may include stages 810-850 and can be applied to a family of devices.

Stage 810 may include collecting empirical measurements of P/E cycled blocks for several flash memory modules, e.g., for a plurality of devices under test (DUTs). Stage 820 may include programming the several flash memory modules with reference data. Stage 830 may include performing threshold voltage scans. Stage 840 may include applying a single retention test on all DUTs. Stage 850 may include finding the closest random function which approximates the retention effect on the programmed cells.

The estimation of the retention probability density function (pdf) can include defining a Gaussian mixture distribution, and estimating its parameters The Gaussian mixture pdf may be defined by:

$$f_K(x) = \frac{1}{D} \sum_{k=1}^{K} p_k \frac{1}{\sqrt{2\pi\sigma_k^2}} e^{-\frac{(x-\mu_k)^2}{2\sigma_k^2}},$$

where pk is a weighting factor, such that:

$$\sum_{k=1}^{K} p_k = 1,$$

and
D is a normalization factor calculated such that the pdf integral is unity. The set of parameters for estimation may be:

$$\{p_k, \mu_k, \sigma_k^2\}_{k=1}^{K}.$$

It is noted that such model may be created for each page and plane, separately. To do this, it is desirable that the number of cycled blocks be large enough to provide a sufficiently large measurements vector.

This estimation problem may be solved by using iterative least mean square error fitting, or by using the expectation maximization (EM) algorithm A. P. Dempster, N. M. Laird, and D. B. Rubin. "Maximum likelihood from incomplete data via the EM algorithm" Journal of the Royal Statistical Society B, vol. 39, no. 1: pp. 1-39, 1977.

The retention model may be created substantially once during the sort process, and/or when creating the initial adaptive parameters set (for each cycling range). This provides a nominal model, based on several devices which represent well the retention behavior of the device family.

According to an embodiment of this invention, the retention model may be automatically updated per device, to compensate for mismatches in the retention model between devices of the same family.

Figure 9:
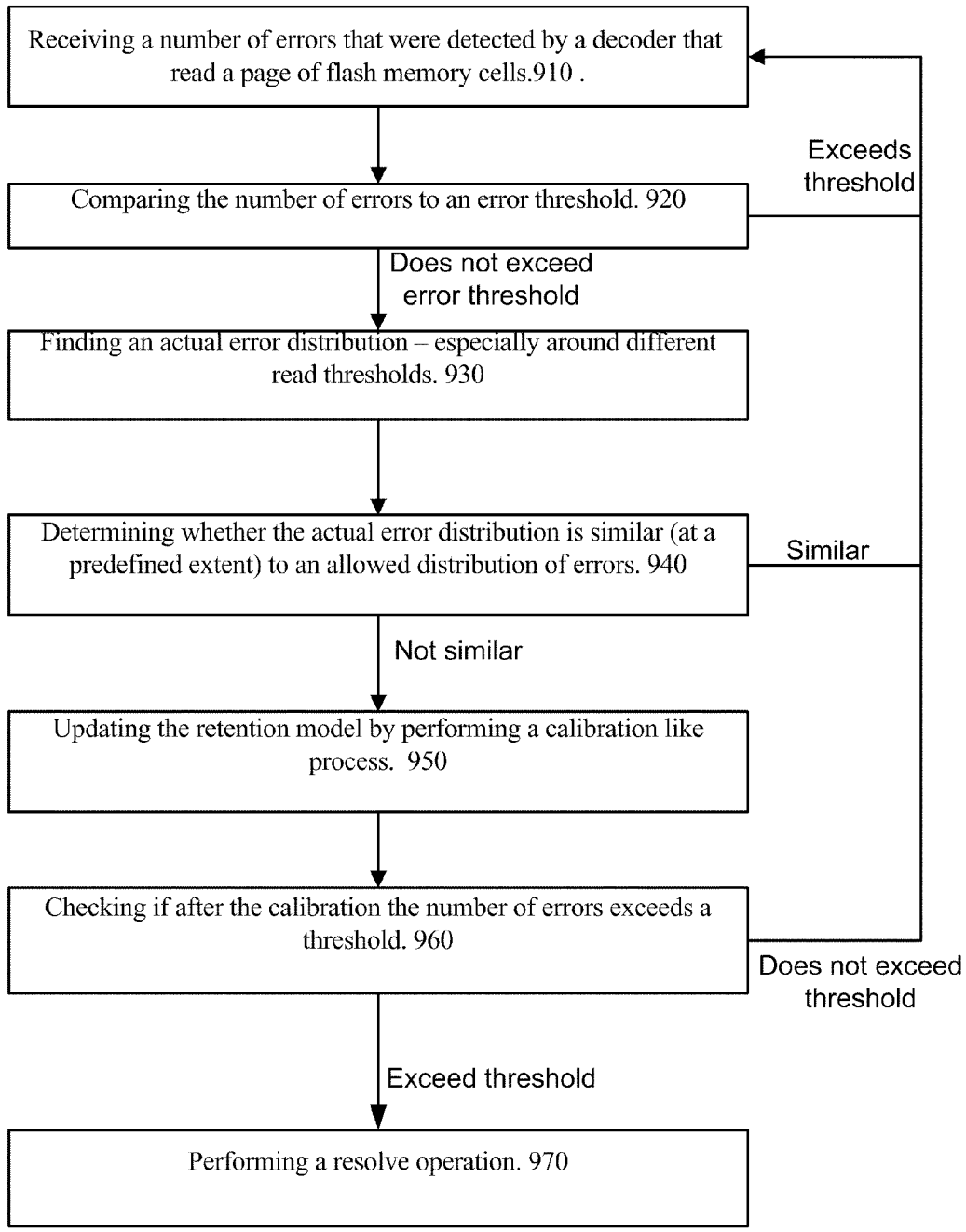
FIG. 9 illustrates a method according to an embodiment of the invention.

FIG. 9 illustrates a method 900 for updating a retention model according to an embodiment of the invention. Method 900 may include stages 910, 920, 930, 940, 950, 960 and 970. Stage 910 may include receiving a number of errors that were detected by a decoder that read a page of flash memory cells. Stage 910 is followed by stage 920.

Stage 920 includes comparing the number of errors to an error threshold and jumping to stage 930 if the number of errors exceeded the error threshold. In this case the page of flash memory cells can be defined as an "old" page. If the number of errors does not exceed the error threshold, then stage 920 may be followed by stage 910.

Stage 930 may include finding an actual error distribution, especially around different read thresholds. Stage 930 may be followed by stage 940, including determining whether the actual error distribution is similar (at a predefined extent) to an allowed distribution of errors. The allowed distribution of errors can be estimated by a retention model.

If the answer at stage 940 is positive, then stage 910 may follow; otherwise, stage 940 may be followed by stage 950, including updating the retention model by performing a calibration-like process. The retention model may be updated and a page need not be reprogrammed For example, if the programming mismatch is small, then the retention model may be updated, and there may be no need to perform re-programming When the programming mismatch is too large, then the page may have to be re-programmed Stage 950 may be followed by stage 960, including checking if after the calibration, the number of errors, e.g., the number of actual errors corrected during page read by the error correcting code (ECC), exceeds a threshold level. If the answer is negative, then stage 960 may be followed by stage 910; otherwise, stage 960 may be followed by stage 970, including performing a resolve operation. A resolve operation may be the re-programming of a page in a different address or onto same location after erasing the block.

According to an embodiment of the invention, a novel resolve mechanism is disclosed, in relation to the herein disclosed process: For "old" pages/blocks with unmatched error distribution, the page/block's content can be copied to another free block, and this block is to be reprogrammed with the updated programming parameters. This is important in order to be able to guarantee full spec retention. This process can be thought of as a refresh operation for non-calibrated programmed pages, where the reprogramming is expected to yield a calibrated programmed data, which may not require refreshing It is assumed that the read thresholds used are carefully set. For some flash devices, the read thresholds may be fixed and non-configurable. For some devices, the read thresholds can be configured by the memory controller, and thus the read location may be optimized to read the memory contents in locations where the overlap of neighboring lobes is sufficiently low.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for programming a page of flash memory cells, the method comprises:
receiving a cycle count indication indicative of a number of program cycles of the page of memory cells;
setting a value of at least one flash memory programming parameter of a programming operation based on the cycle count indication; and
programming at least one flash memory cell of the page of flash memory cells by performing the programming operation; wherein the programming parameter is a size of a programming step of a sequence of programming pulses that are supplied to a flash memory cell during the programming operation.

2. A method for programming a page of flash memory cells, the method comprises:
receiving a cycle count indication indicative of a number of program cycles of the page of memory cells;
setting a value of at least one flash memory programming parameter of a programming operation based on the cycle count indication; and programming at least one flash memory cell of the page of flash memory cells by performing the programming operation; wherein the programming parameter is a target threshold voltage level of a flash memory cell that represents a target logic value; and
setting the target threshold voltage level based on a mapping between cycle count indication ranges and target voltage levels.

3. A method for programming a page of flash memory cells, the method comprises:
receiving a cycle count indication indicative of a number of program cycles of the page of memory cells;
setting a value of at least one flash memory programming parameter of a programming operation based on the cycle count indication; and programming at least one flash memory cell of the page of flash memory cells by performing the programming operation; wherein the programming parameter is a threshold voltage window that comprises multiple target voltage levels of a flash memory cell, the multiple target voltage levels represent multiple target logic values.

4. The method according to claim 3, wherein an initial threshold voltage window that is set at a beginning of life of the page of flash memory cells is smaller than half of a final threshold voltage window that is set at an end of life of the page of flash memory cells.

5. A method for programming a page of flash memory cells, the method comprises:
receiving a cycle count indication indicative of a number of program cycles of the page of memory cells;
setting a value of at least one flash memory programming parameter of a programming operation based on the cycle count indication; and
programming at least one flash memory cell of the page of flash memory cells by performing the programming operation;
setting a value of at least one erase parameter of an erase operation based on the cycle count indication; and
erasing at least one flash memory cell of the page of flash memory cells by performing the erase operation.

6. A method for programming a page of flash memory cells, the method comprises:
receiving a cycle count indication indicative of a number of program cycles of the page of memory cells;
setting a value of at least one flash memory programming parameter of a programming operation based on the cycle count indication; and
programming at least one flash memory cell of the page of flash memory cells by performing the programming operation;
receiving distribution information that is indicative of a distribution of actual threshold voltages of flash memory cells of the page of flash memory cells; wherein the setting of the value of the programming parameter is further based on the distribution information.

7. A method for programming a page of flash memory cells, the method comprises:
receiving a cycle count indication indicative of a number of program cycles of the page of memory cells;
setting a value of at least one flash memory programming parameter of a programming operation based on the cycle count indication; and programming at least one flash memory cell of the page of flash memory cells by performing the programming operation;

receiving distribution information that is indicative of a distribution of actual threshold voltages of flash memory cells of the page of flash memory cells;

applying a statistical retention model on the distribution information to provide an estimated distribution information; and setting the value of the programming parameter based on the estimated distribution information and on the cycle count indication.

8. The method according to claim 7 comprising repeating the stages of receiving distribution information, applying a statistical retention model, setting the value of the programming parameter and programming the at least one flash memory cell until reaching a desired distribution of threshold voltages of flash memory cells.

9. The method according to claim 7, wherein the programming parameter is a size of a programming step of a sequence of programming pulses that are supplied to a flash memory cell during the programming operation.

10. The method according to claim 7, wherein the programming parameter is a value of a first programming pulse out of a sequence of programming pulses that are supplied to a flash memory cell during the programming operation of the flash memory cell.

11. The method according to claim 7, wherein the programming parameter is a target threshold voltage level of a flash memory cell that represents a target logic value.

12. The method according to claim 7, wherein the estimated distribution information is received at a first point in time and is indicative of an estimated distribution of threshold voltages of flash memory cells of the page of flash memory cells at a second point in time that follows the first point in time; wherein the method comprises:

receiving updated distribution information indicative of a distribution of actual threshold voltages of flash memory cells of the page of flash memory cells at the second point in time; and updating the statistical retention model based on a difference between the estimated distribution information and the updated distribution information.

13. A method for programming a page of flash memory cells, the method comprises:

receiving a cycle count indication indicative of a number of program cycles of the page of memory cells;

setting a value of at least one flash memory programming parameter of a programming operation based on the cycle count indication; and programming at least one flash memory cell of the page of flash memory cells by performing the programming operation;

receiving distribution information that is indicative of a distribution of actual threshold voltages of flash memory cells of the page of flash memory cells;

determining a distribution of errors among different target voltage levels; and re-programming the page of flash memory cells if the level of uniformity of the distribution is below a threshold.

14. A method for programming a page of flash memory cells, the method comprises:

receiving a cycle count indication indicative of a number of program cycles of the page of memory cells;

setting a value of at least one flash memory programming parameter of a programming operation based on the cycle count indication; and programming at least one flash memory cell of the page of flash memory cells by performing the programming operation;

receiving distribution information that is indicative of a distribution of actual threshold voltages of flash memory cells of the page of flash memory cells;

estimating a distribution of threshold voltages of flash memory cell at an end of life of the page of flash memory cells to provide an estimated distribution information; and setting of the value of the programming parameter based on the estimated distribution information and on the cycle count indication.

15. A flash memory module, comprising:

a flash memory unit that comprises at least one page of flash memory cells; and a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation; wherein the programming parameter is a size of a programming step of a sequence of programming pulses that are supplied to a flash memory cell during the programming operation.

16. A flash memory module, comprising:

a flash memory unit that comprises at least one page of flash memory cells; and a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation: wherein the controller is configured to set the programming parameter is a target threshold voltage level of a flash memory cell that represents a target logic value;

wherein the controller is configured to increase a target threshold voltage level as a result of an increase in the number of program cycles.

17. A flash memory module, comprising:

a flash memory unit that comprises at least one page of flash memory cells; and a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation; wherein the controller is configured to set the programming parameter is a target threshold voltage level of a flash memory cell that represents a target logic value;

wherein the controller is configured to set the target threshold voltage level based on a mapping between cycle count indication ranges and target voltage levels.

18. A flash memory module, comprising:

a flash memory unit that comprises at least one page of flash memory cells; and a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation;
wherein the programming parameter is a threshold voltage window that comprises multiple target voltage levels of a flash memory cell that represent multiple target logic values.

19. The flash memory module according to claim 18, wherein an initial threshold voltage window that is set by the controller at a beginning of life of the page of flash memory cells is smaller than half of a final threshold voltage window that is set by the controller at an end of life of the page of flash memory cells.

20. A flash memory module, comprising:
a flash memory unit that comprises at least one page of flash memory cells; and
a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation; wherein the controller is configured to;
set a value of at least one erase parameter of an erase operation based on the cycle count indication; and
erase at least one flash memory cell of the page of flash memory cells by performing the erase operation.

21. A flash memory module, comprising:
a flash memory unit that comprises at least one page of flash memory cells; and
a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation; wherein the controller is configured to:
receive distribution information that is indicative of a distribution of actual threshold voltages of flash memory cells of the page of flash memory cells; and
set of the value of the programming parameter is further based on the distribution information.

22. A flash memory module, comprising:
a flash memory unit that comprises at least one page of flash memory cells; and
a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation;
wherein the controller is configured to:
receive distribution information that is indicative of a distribution of actual threshold voltages of flash memory cells of the page of flash memory cells;
apply a statistical retention model on the distribution information to provide an estimated distribution information; and
set the value of the programming parameter based on the estimated distribution information and on the cycle count indication.

23. The flash memory module according to claim 22 wherein the controller is configured to repeat a receiving of distribution information, an applying of a statistical retention model, a setting of the value of the programming parameter and programming the at least one flash memory cell until reaching a desired distribution of threshold voltages of flash memory cells.

24. The flash memory module according to claim 22, wherein the programming parameter is a size of a programming step of a sequence of programming pulses that are supplied to a flash memory cell during the programming operation.

25. The flash memory module according to claim 22, wherein the programming parameter is a value of a first programming pulse out of a sequence of programming pulses that are supplied to a flash memory cell during the programming operation of the flash memory cell.

26. The flash memory module according to claim 22, wherein the programming parameter is a target threshold voltage level of a flash memory cell that represents a target logic value.

27. The flash memory module according to claim 22, wherein the estimated distribution information is received by the controller at a first point in time and is indicative of an estimated distribution of threshold voltages of flash memory cells of the page of flash memory cells at a second point in time that follows the first point in time;
wherein the controller is further configured to receive updated distribution information indicative of a distribution of actual threshold voltages of flash memory cells of the page of flash memory cells at the second point in time, and update the statistical retention model based on a difference between the estimated distribution information and the updated distribution information.

28. A flash memory module, comprising:
a flash memory unit that comprises at least one page of flash memory cells; and
a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation;
wherein the controller is configured to:
receive distribution information that is indicative of a distribution of actual threshold voltages of flash memory cells of the page of flash memory cells;
determine a level of uniformity of errors among different target voltage levels; and
re-program the page of flash memory cells if the level of uniformity is lower than a threshold.

29. A flash memory module, comprising:
a flash memory unit that comprises at least one page of flash memory cells; and
a controller, for receiving a cycle count indication indicative of a number of program cycles of the page of memory cells, for setting a value of a programming parameter of a programming operation based on the cycle count indication; and for programming at least one flash memory cell of the page of flash memory cells by performing the programming operation;
wherein the controller is configured to:
receive distribution information that is indicative of a distribution of actual threshold voltages of flash memory cells of the page of flash memory cells;
estimate a distribution of threshold voltages of flash memory cell at an end of life of the page of flash memory cells to provide an estimated distribution information; and
set the value of the programming parameter based on the estimated distribution information and on the cycle count indication.

* * * * *